US008198905B2

(12) United States Patent
Sussmeier et al.

(10) Patent No.: US 8,198,905 B2
(45) Date of Patent: Jun. 12, 2012

(54) ENVELOPE MOISTENING DETECTOR

(75) Inventors: John W. Sussmeier, Cold Spring, NY (US); Gregory P. Skinger, Southbury, CT (US); Eddy Edel, New Milford, CT (US)

(73) Assignee: Pitney Bowes Inc., Stamford, CT (US)

( * ) Notice: Subject to any disclaimer, the term of this patent is extended or adjusted under 35 U.S.C. 154(b) by 457 days.

(21) Appl. No.: 12/578,248

(22) Filed: Oct. 13, 2009

(65) Prior Publication Data

US 2011/0084710 A1 Apr. 14, 2011

(51) Int. Cl.
*G01R 27/26* (2006.01)

(52) U.S. Cl. .......................... 324/663; 324/664; 324/658

(58) Field of Classification Search ................... 324/663
See application file for complete search history.

(56) References Cited

U.S. PATENT DOCUMENTS

| | | | | |
|---|---|---|---|---|
| 2003/0111165 A1* | 6/2003 | Allen et al. | ................... | 156/227 |
| 2010/0089003 A1* | 4/2010 | Reichelsheimer et al. | ....... | 53/75 |
| 2010/0089986 A1* | 4/2010 | Kline et al. | ..................... | 229/80 |
| 2011/0126958 A1* | 6/2011 | Kline | ............................. | 156/64 |

* cited by examiner

*Primary Examiner* — Thomas Valone
(74) *Attorney, Agent, or Firm* — Michael J. Cummings; Charles R. Malandra, Jr.; Steven J. Shapiro

(57) ABSTRACT

A mailing system includes a mailing machine having an envelope feed path, a sealing system configured to apply a liquid to an envelope in the envelope feed path, a capacitive sensor located in the envelope feed path downstream from the sealing system, and a controller connected to the capacitive sensor. The sealing system may include a liquid reservoir and a liquid applicator. The capacitive sensor is configured to measure a quantity of liquid on a portion of the envelope applied by the sealing system and to generate a signal based on the measured quantity. The controller is configured to perform an operation based on the measured quantity signal from the capacitive sensor.

21 Claims, 3 Drawing Sheets

ENVELOPE MOISTENING DETECTOR

FIELD OF THE INVENTION

The invention relates to an envelope sealing system and, more particularly, to measuring the presence of liquid applied to an envelope.

BACKGROUND OF THE INVENTION

Conventional mailing machines generate large quantities of mail that are either poorly sealed or not sealed at all due to undetected failures associated with the envelope sealing system.

Conventional sealing systems suffer from an inability to detect if sufficient liquid quantity has actually been applied to an envelope. Such conventional sealing systems detect only the absence of liquid at various locations in the system, not the quantity of liquid present. The detection components in conventional sealing systems are inadequate because, although liquid may be present in the system, there may be an insufficient quantity of liquid applied to envelopes to effect proper sealing of the envelopes.

SUMMARY OF EXEMPLARY ASPECTS

In the following description, certain aspects and embodiments of the present invention will become evident. It should be understood that the invention, in its broadest sense, could be practiced without having one or more features of these aspects and embodiments. It should also be understood that these aspects and embodiments are merely exemplary.

In accordance with the purpose of the invention, as embodied and broadly described herein, one aspect of the invention relates to an envelope moistening detection system comprising a capacitive sensor and a controller. The capacitive sensor is located in an envelope feed path downstream from a liquid application device of an envelope sealing apparatus. The liquid may comprise water or other fluids used to activate an adhesive present on the envelope. In alternative embodiments, the liquid may comprise the adhesive.

Reference is made herein to embodiments where the liquid comprises water, including the terms "water supply tank" and "water pump." It should be understood that the term "water" is used interchangeably with "liquid," and that, as discussed above, liquids other than water may also be used.

The capacitive sensor is configured to measure a quantity of liquid on a portion of an envelope, applied by the liquid application device, and generate a signal based on the measured quantity. The controller is connected to the capacitive sensor. The controller is configured to perform an operation based on the measured quantity signal from the capacitive sensor.

In another aspect, the invention relates to a mailing system, comprising a mailing machine having an envelope feed path, a sealing system configured to apply a liquid to an envelope in the envelope feed path, a capacitive sensor located in the envelope feed path downstream from the sealing system, and a controller connected to the capacitive sensor. As used herein, "mailing machine" encompasses mail and document management systems, including, for example, postage metering devices, document assembly and/or creation devices, such as inserting systems, and other systems for handling mailpieces and/or components thereof.

In some embodiments, the sealing system comprises a liquid reservoir and a liquid applicator. In further embodiments, the capacitive sensor is configured to measure a quantity of liquid on a portion of the envelope applied by the sealing system and to generate a signal based on the measured quantity. The controller may be configured to perform an operation based on the measured quantity signal from the capacitive sensor.

In a further aspect, the invention provides a method of operating a mailing system, comprising positioning an envelope on an envelope feed path of a mailing machine, applying a liquid to the envelope using a sealing system, measuring a quantity of liquid on a portion of the envelope applied by the sealing system, generating a signal using the capacitive sensor based on the measured quantity, and performing an operation based on the measured quantity signal from the capacitive sensor using a controller connected to the capacitive sensor. In one embodiment, the sealing system comprises a liquid reservoir and a liquid applicator. In further embodiments, the quantity of liquid is measured using a capacitive sensor located in the envelope feed path downstream from the sealing system.

Aside from the structural and procedural arrangements set forth above, the invention could include a number of other arrangements, such as those explained hereinafter. It is to be understood that both the foregoing description and the following description are exemplary only.

BRIEF DESCRIPTION OF THE DRAWINGS

The accompanying drawings, which are incorporated in and constitute a part of this specification, illustrate exemplary embodiments of the invention and, together with the description, serve to explain the principles of the invention. In the drawings.

DETAILED DESCRIPTION OF EXEMPLARY EMBODIMENTS

Figure 1:
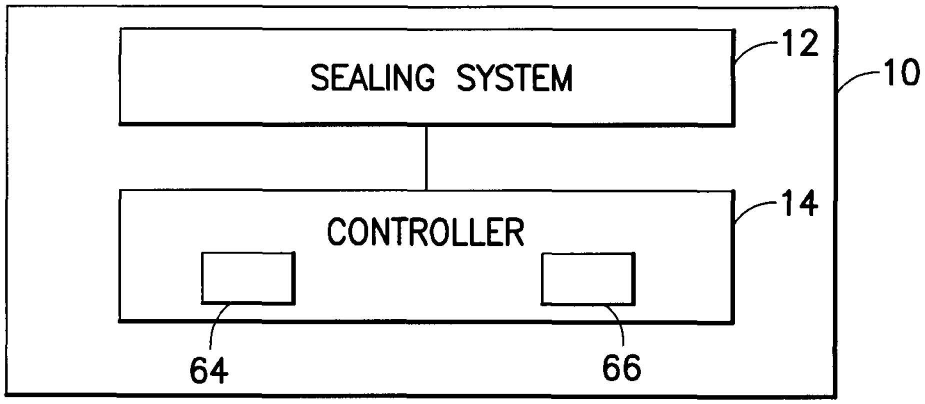
FIG. 1 is a diagram illustrating an embodiment of a device according to the invention.

Reference will now be made in detail to exemplary embodiments of the invention, examples of which are illustrated in the accompanying drawings. Wherever possible, the same reference numbers will be used throughout the drawings to refer to the same or like parts.

Although the invention will be described with reference to the exemplary embodiments shown in the drawings, it should be understood that the invention can be embodied in many alternate forms of embodiments. In addition, any suitable size, shape or type of elements or materials may be used.

Figure 2:
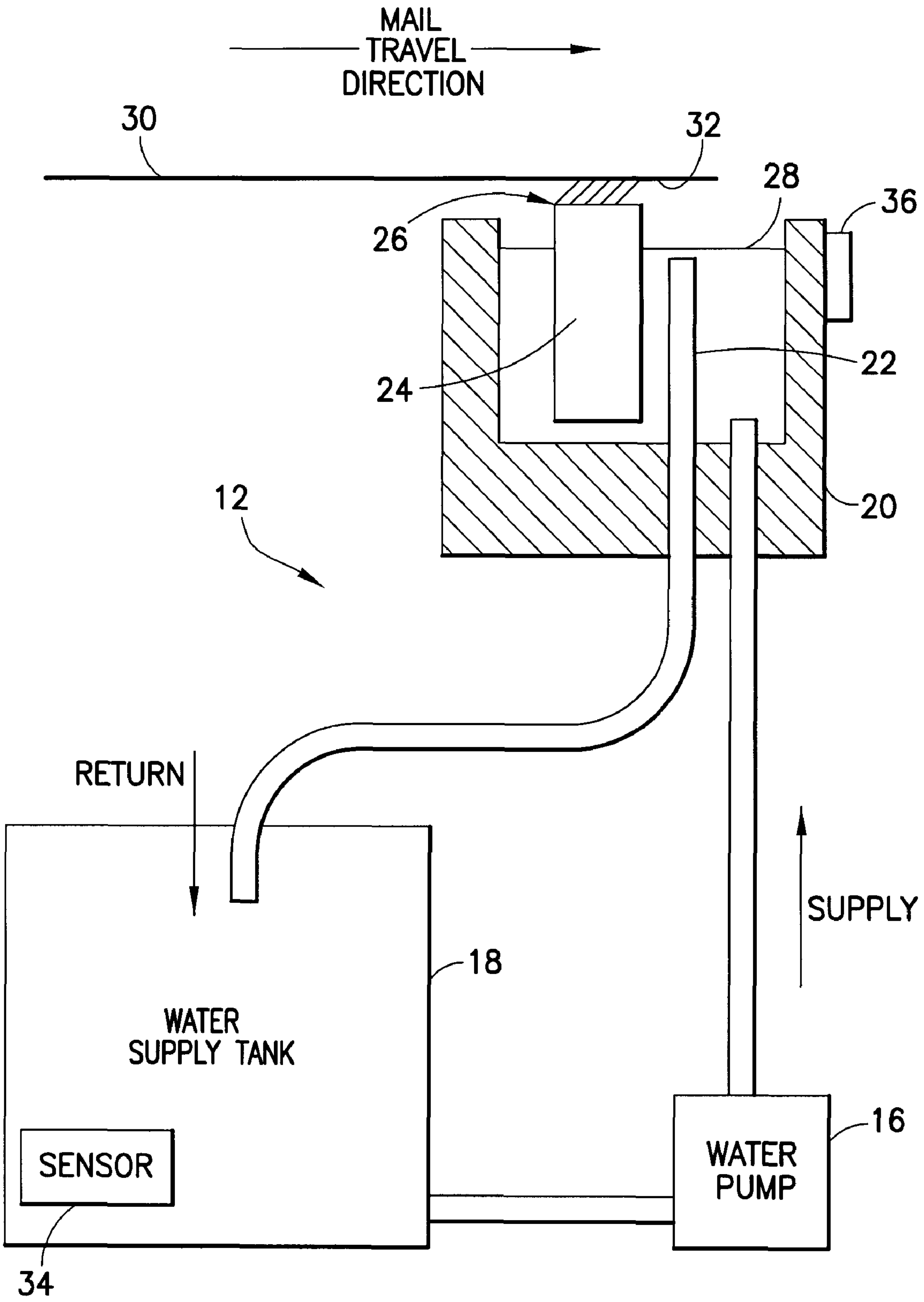
FIG. 2 is a schematic view of several components of the device shown in FIG. 1.
Figure 3:
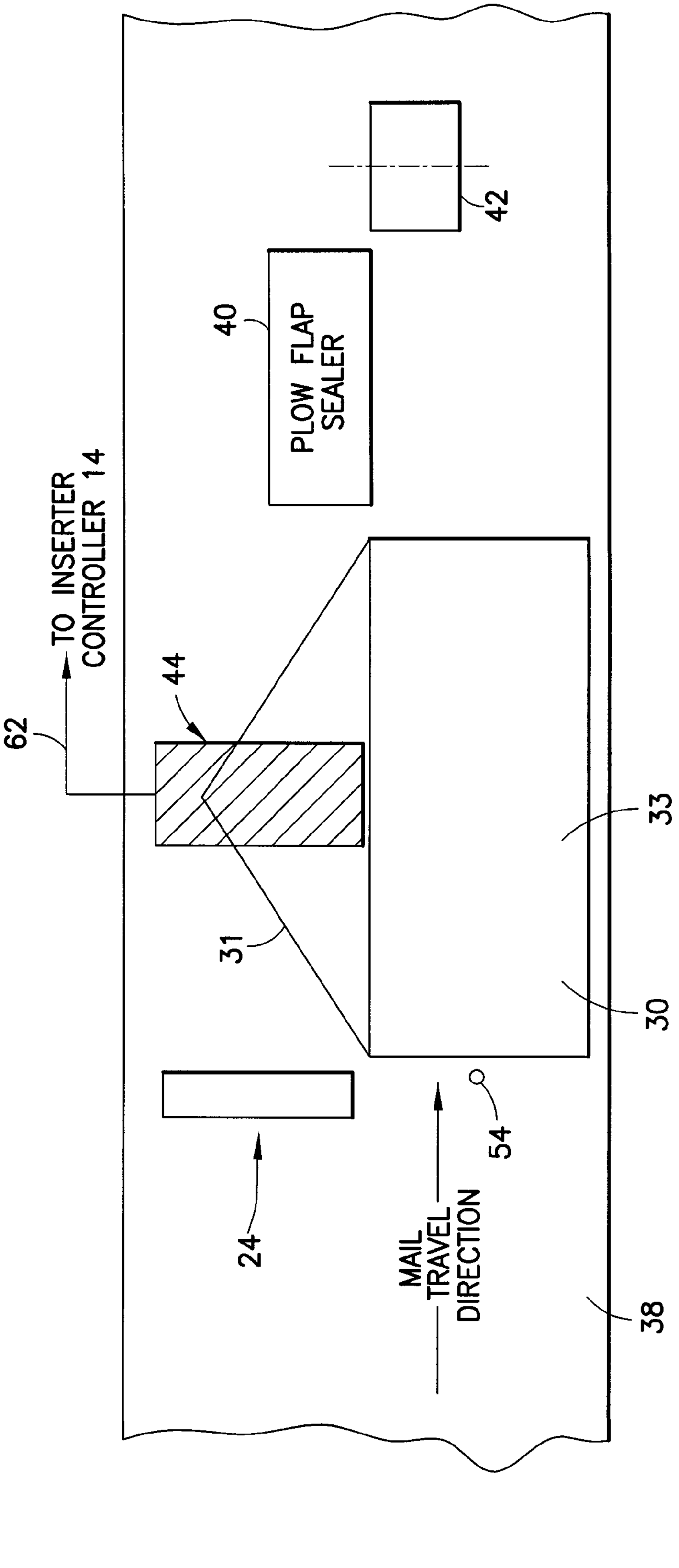
FIG. 3 is a further schematic view of several components of the device shown in FIG. 1.

FIG. 1 illustrates an embodiment of a mailing system 10 according to the invention. The mailing system 10 comprises a sealing system 12 and a controller 14. In the illustrated embodiment, the controller 14 comprises a memory 64 and a processor 66. Referring also to FIGS. 2 and 3, the sealing system 12 in the illustrated embodiment comprises a water pump 16, which delivers water from a liquid reservoir, e.g., water supply tank 18, to a brush tank 20 of a liquid applicator. Once the water level 28 rises in the brush tank 20 to a height slightly above a stand pipe 22, water flows through the stand pipe 22 and returns back to the supply tank 18 via gravity. This arrangement provides a substantially constant water height in the brush tank 20.

A brush assembly 24 is submerged in the brush tank 20 such that the height of the bristle tips 26 are well controlled with respect to the water level height 28 in the brush tank 20. Capillary action between individual brush bristles delivers water up the brush assembly 24 to the brush bristle tips 26. The water is then applied to a passing face-up envelope 30 that has its flap adhesive surface 32 contacting the bristle tips 26.

The mass flow rate of water traveling up the brush assembly 24 to the envelope flap surface 32 is determined by the vertical height between the tank water level 28 and the envelope. Higher flow rates can be achieved by raising the height of the water in the tank 20 closer to the horizontal envelope plane, such as with a taller stand pipe, for example. It has been empirically determined that the optimum flow rate for providing a properly sealed envelope is enough to deliver between 40 mg to 70 mg of water for each envelope, depending on envelope porosity and the adhesive type.

A first water sensor 34 is provided to send a signal to the controller 14 when the water in the supply tank 18 falls below a pre-established level. In some embodiments, the first sensor 34 comprises a float-type sensor. Other types of sensors may also be used.

The warning signal alerts a system operator that the tank 18 must be refilled with water within a certain amount of machine usage or the machine will automatically stop generating mail. The first sensor 34 senses only a low water condition in the supply tank 18 and is not configured to detect sealing system failures located between the supply tank 18 and the envelope flap 32. Accordingly, the first sensor 34 may fail to detect water pump failures, the water pump losing its prime, water supply lines getting pinched thereby limiting flow rates, improper brush assembly installation, brush damage, and brush contamination with paper dust, dirt, or adhesive.

A second water sensor 36 is provided to send a signal to the controller 14 when the water in the brush tank 20 falls below a pre-established level. In one embodiment, the second water sensor 36 comprises a float-type sensor. Alternatively, the second water sensor may comprise a capacitive-type sensor that senses the presence of water through the tank wall, which may comprise plastic or other comparable materials. Other types of sensors may also be used.

When the water level 28 falls below a pre-established height in the brush tank 20, the second water sensor 36 detects the absence of water and notifies the controller 14. The second water sensor 36 may fail to detect improper brush assembly installation, brush damage, and brush contamination with paper dust, dirt or adhesive.

As seen in FIG. 3, located downstream from the brush assembly 24 along the envelope feed path 38 is a plow flap sealer 40 and a compression roller 42. The plow flap sealer 40 is configured for rotating the flap 31 of the envelope 30 back onto the envelope body 33. The compression roller 42 is configured to assist with squeezing the adhesive on the flap 31 into the pores of the paper of the envelope body 33.

Figure 4:
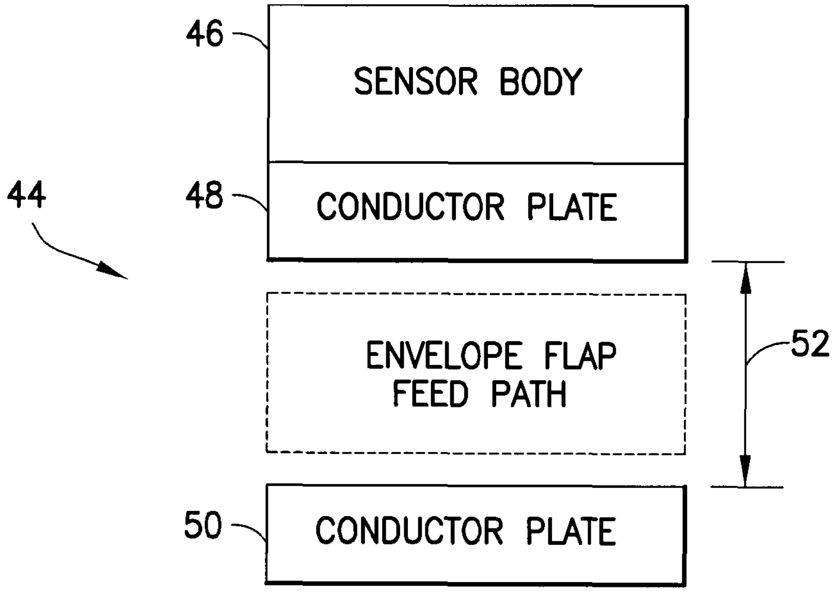
FIG. 4 is a schematic view of an embodiment of the capacitive sensor shown in FIG. 3.

Located between the brush assembly 24, where the water is applied to the adhesive on the flap 31, and the plow flap sealer 40 is a capacitive sensor 44 for determining a quantity of water applied to the envelope flap 31. In the embodiment shown in FIG. 4, the capacitive sensor 44 comprises a sensor body 46 having a first electrical conductor plate 48 and a second electrical conductor plate 50. The second conductor plate 50 forms a reference plate that is located some gap distance 52 directly above or below the first conductor plate 48 on the sensor body 46. The first conductor plate 48 associated with the sensor body 46 and the reference plate 50 mounted beneath it are parallel to one another, and the gap 52 between them is sized to allow moistened envelope flaps 31 to pass between them.

For both low and high volume applications, machine confirmation that individual envelopes are moistened for subsequent sealing is highly desirable. When sealing failures are undetected, mail can enter the mailstream unsealed. This may cause processing problems for automated sortation equipment at mail processing and postal facilities. Further, such failures may cause mailpiece damage and associated recipient dissatisfaction, particularly if the mail contents include sensitive or confidential information.

Embodiments of the invention relate to an envelope moistening detector. The device of the invention may help solve problems associated with insufficient water quantity applied to an envelope by measuring the presence of water actually applied to an envelope flap. Aspects of the invention may include the introduction of a capacitive sensing device to the paper path of an envelope sealing system, and a method for determining if sufficient water has been deposited onto an envelope flap for reliable sealing. Systems in accordance with the invention may provide a highly reliable method for detecting if the proper amount of water has been applied to an envelope flap for reliable sealing.

Capacitive sensors may be effective in measuring the presence, density, thickness, and location of non-conducting materials. Non-conductive materials such as paper, adhesive and water have different dielectric constants (sometimes called relative static permittivity). The dielectric constant is the ratio of the amount of stored electrical energy (permittivity) when a potential is applied, relative to the permittivity of a vacuum. For reference, approximate dielectric constants for different mediums/materials are as follows:

| | |
|---|---|
| Air | 1.0 |
| Paper | 2.0 |
| Adhesive | less than 10, depending on the type |
| Water | 80.0 |

The dielectric constant determines how a non-conductive material affects capacitance between two conductors. In the illustrated embodiments, only one conduction plate is located in the sensor body. For the invention, the presence of a non-conductive material placed between the reference plate and the sensor changes the dielectric and, therefore, changes the capacitance. The capacitance will change in relationship to the thickness, density, and type of material placed in the gap 52.

Figure 5:
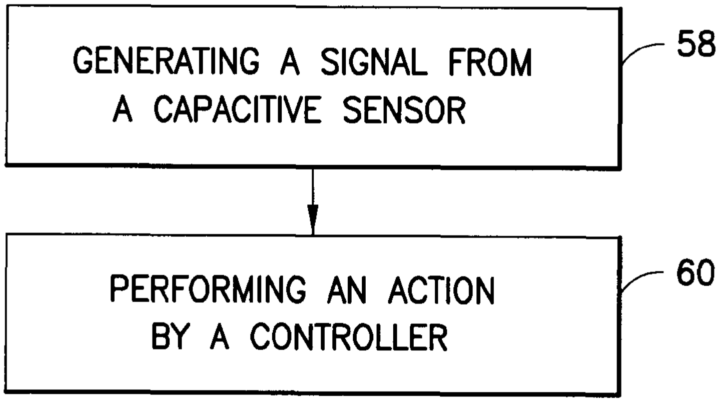
FIG. 5 is a flowchart illustrating an embodiment of a method according to the invention.

Referring also to FIG. 5, a method according to the invention comprises generating a signal 62 (see FIG. 3) from the capacitive sensor 44 based on the quantity of water on the envelope as indicated by block 58, and performing an action by the controller 14 based on the signal from the capacitive sensor as indicated by block 60.

The controller is configured to compare the measured quantity signal to at least one reference value. The controller may be configured to send a signal to outsort the envelope from the feed path when the measured quantity signal is less than the reference value. The signal 62 from the capacitive sensor 44 may be a voltage indicating capacitance through paper and adhesive which form the envelope, and the water. The action could be, for example, outsorting, i.e., removing, an envelope with a determined insufficient quantity of water, and/or sending a signal to an operator that the quantity of water is below a desired level, and/or stopping the automated machine until the water quantity issue is resolved. The capacitive sensor may be configured to send multiple signals to the controller for a plurality of the portions of the envelope.

According to embodiments of the invention, the more water on the envelope flap sensed by the sensor 44, the larger the signal from the sensor 44 to the controller 14. Thus, the signal from the sensor 44 varies based on the quantity of water sensed by the sensor. In an alternate embodiment, the sensor could be configured to send a signal only when a certain amount of water is sensed or only when a certain amount of water is not sensed.

The sensing device may first be calibrated by establishing two calibration points to define the approximate range of the measurement of the sensor. These two calibration points can be taken with a dry envelope and a wet envelope (one which is known to be sufficiently moistened for proper adhesive sealing). For the dry envelope, a value is measured that represents paper and adhesive. For the wet envelope, a value is measured that represents paper, adhesive, and water. Since water has a relatively high dielectric constant as compared with paper and adhesive, the range for the measurement is expected to be large, making this sensing method very reliable.

In one example, before a mail run begins, this calibration operation may be accomplished automatically in a mail inserting machine by feeding and processing two empty envelopes on the mail output system (MOS) and actuating a no-seal accessory for one of the envelopes. The no-seal accessory is a device that is located immediately upstream of the brush assembly that, when activated, lifts upward to deflect the envelope flap upward so that the flap does not contact the applicator brush tips.

In one embodiment, both envelopes are outsorted and checked by an operator to verify that one envelope is dry and one envelope has sufficient water applied for a reliable seal. If additional accuracy is desired, the variability of the calibration procedure can be reduced by calibrating additional envelopes in both dry and wet conditions and averaging the results for each case.

By way of example, the sensor 44 and controller 14 may be calibrated for a dry envelope and set to a value of zero, and the sensor 44 and controller 14 may be calibrated for a wet envelope and set to a value of 100. It may then be determined that a threshold value of 50 is sufficiently low to correspond to a low limit on the amount of water that can be present on an envelope flap before sealing reliability becomes compromised. Therefore, during the mail run, if any envelope receives a value of 50 or less, the apparatus 10 can automatically stop generating mail and outsort that envelope for operator inspection. Thus, according to this example, for a normal mail run where there are no sealing failures, all values will be greater than 50 and will be normally distributed around 100. Other calibration limits and ranges may also be used.

In some embodiments, design implementation of the invention is fail-safe, i.e., the mailing system 10 will stop generating mail if the measured quantity signal from the capacitive sensor 44 is less than a reference value.

More than two calibration points could be used for different actions or operations. For example, too much water quantity could be sensed, and/or more than a single action or operation could performed by the controller 14 based on a variety of different quantities of water being sensed.

Operation may also comprise a "trigger" input to the sensor, synchronized to the envelope flap being correctly positioned between the sensor body and the reference plate. This may be carried out in a variety of ways. In one arrangement, a trigger photocell 54 (see FIG. 3) may be located upstream of the sensor 44. The photocell 54 senses the lead edge of a moving envelope and, from this event, either a position or time delay is added to accommodate the envelope length used in the mail run. Position information for the traveling envelope is readily available when an encoder is present in the transport system. Sensing should ideally occur in a region that spans around the nominal center of the envelope length, as shown in FIG. 3.

Measurement data used to arrive at a final value for each envelope may comprise a number data points taken at the sampling rate of the sensing device 44, as opposed to a single data point. For example, if the envelope is a #10 style which is 9.5 inches long and the MOS has a velocity of 100 in/s, some portion of the flap will be in the sensing region for 95 ms, corresponding to 9.5 inches/100 in/s. If the sampling rate of the sensor is 16 ms, the measurement length may be chosen to be 95/16, which is roughly six sample data points.

Post-processing of these data values by the controller 14 may include any number of mathematical operations that will provide a final value representing the amount of water deposited on an envelope flap relative to the two calibration values arrived at using the same mathematical operations. For example, averaging the data has the advantage over a single data point such that variability of the measurement is reduced. In another example, summing the data has an advantage over a single data point such that it effectively represents the total amount of water applied over the entire flap length.

As noted above, the controller 14 may comprise a memory 64. The memory 64 may be used as a program storage device readable by a machine, tangibly embodying a program of instructions executable by the machine for performing operations, the operations comprising comparing a sensor value obtained or mathematically derived from at least one signal from a capacitive sensor to a stored reference value by a controller, wherein the signal from the capacitive sensor is based on a measured quantity of water on an envelope in an envelope feed path, and sending a signal or instruction to perform an operation, such as an outsort signal by the controller to outsort the envelope from the feed path based, at least partially, on the comparison of the sensor value and the reference value. The software may also be located on another type of medium, such as a CD ROM, for example.

It will be apparent to those skilled in the art that various modifications and variations can be made to the structure and methodology described herein. Thus, it should be understood that the invention is not limited to the examples discussed in the specification. Rather, the present invention is intended to cover modifications and variations.

What is claimed is:

1. An envelope moistening detection system, comprising:

a capacitive sensor located in an envelope feed path downstream from a liquid application device of an envelope sealing apparatus, wherein the capacitive sensor is configured to measure a quantity of liquid on a portion of an envelope applied by the liquid application device and to generate a signal based on the measured quantity; and a controller connected to the capacitive sensor, wherein the controller is configured to perform an operation based on the measured quantity signal from the capacitive sensor.

2. The envelope moistening detection system of claim 1, wherein the capacitive sensor is configured to generate a voltage indicating capacitance of the envelope.

3. The envelope moistening detection system of claim 1, wherein the capacitive sensor comprises a first conductor plate associated with a sensor body and a second conductor plate located a spaced distance from the first conductor plate, wherein the envelope feed path extends between the two plates.

4. The envelope moistening detection system of claim 1, wherein the controller is configured to compare the measured quantity signal to a reference value.

5. The envelope moistening detection system of claim 4, wherein the controller is configured to send a signal to outsort the envelope from the feed path when the measured quantity signal is less than the reference value.

6. The envelope moistening detection system of claim 1, wherein the capacitive sensor is configured to send signals to the controller corresponding to measurements of liquid on a plurality of portions of the envelope.

7. The envelope moistening detection system of claim 6, wherein the controller is configured to perform a mathematical operation that includes the signals to produce a resultant value, and to compare the resultant value to a reference value.

8. The envelope moistening detection system of claim 7, wherein the controller is configured to send a signal to outsort the envelope from the feed path when the resultant value is less than the reference value.

9. The envelope moistening detection system of claim 7, wherein the resultant value comprises one of an average and a sum.

10. A mailing system, comprising:

a mailing machine having an envelope feed path;

a sealing system configured to apply a liquid to an envelope in the envelope feed path, wherein the sealing system comprises a liquid reservoir and a liquid applicator;

a capacitive sensor located in the envelope feed path downstream from the sealing system, wherein the capacitive sensor is configured to measure a quantity of liquid on a portion of the envelope applied by the sealing system and to generate a signal based on the measured quantity; and a controller connected to the capacitive sensor, wherein the controller is configured to perform an operation based on the measured quantity signal from the capacitive sensor.

11. The mailing system of claim 10, wherein the capacitive sensor is configured to generate a voltage indicating capacitance of the envelope.

12. The mailing system of claim 10, wherein the capacitive sensor comprises a first conductor plate associated with a sensor body and a second conductor plate located a spaced distance from the first conductor plate, wherein the envelope feed path extends between the two plates.

13. The mailing system of claim 10, wherein the controller is configured to compare the measured quantity signal to a reference value.

14. The mailing system of claim 13, wherein the controller is configured to send a signal to outsort the envelope from the feed path when the measured quantity signal is less than the reference value.

15. The mailing system of claim 10, wherein the capacitive sensor is configured to send signals to the controller corresponding to measurements of liquid on a plurality of portions of the envelope.

16. The mailing system of claim 15, wherein the controller is configured to perform a mathematical operation that includes the signals to produce a resultant value, and to compare the resultant value to a reference value.

17. The mailing system of claim 16, wherein the controller is configured to send a signal to outsort the envelope from the feed path when the resultant value is less than the reference value.

18. The mailing system of claim 16, wherein the resultant value comprises one of an average and a sum.

19. A method of operating a mailing system, comprising:

positioning an envelope on an envelope feed path of a mailing machine;

applying a liquid to the envelope using a sealing system, wherein the sealing system comprises a liquid reservoir and a liquid applicator;

measuring a quantity of liquid on a portion of the envelope applied by the sealing system using a capacitive sensor located in the envelope feed path downstream from the sealing system;

generating a signal using the capacitive sensor based on the measured quantity; and performing an operation based on the measured quantity signal from the capacitive sensor using a controller connected to the capacitive sensor.

20. The method of claim 19, wherein measuring a quantity of liquid on a portion of the envelope comprises measuring capacitance of the envelope.

21. The method of claim 19, further comprising comparing the measured quantity signal to a reference value, wherein performing an operation based on the measured quantity signal comprises sending a signal to outsort the envelope from the envelope feed path when the measured quantity signal is less than the reference value.

* * * * *